(12) United States Patent
von Ammon et al.

(10) Patent No.: US 8,454,746 B2
(45) Date of Patent: Jun. 4, 2013

(54) METHOD FOR PRODUCING A SINGLE CRYSTAL COMPOSED OF SILICON USING MOLTEN GRANULES

(75) Inventors: Wilfried von Ammon, Hochburg (AT); Ludwig Altmannshofer, Massing (DE)

(73) Assignee: Siltronic AG, Munich (DE)

( * ) Notice: Subject to any disclaimer, the term of this patent is extended or adjusted under 35 U.S.C. 154(b) by 191 days.

(21) Appl. No.: 13/008,053

(22) Filed: Jan. 18, 2011

(65) Prior Publication Data
US 2011/0185963 A1 Aug. 4, 2011

(30) Foreign Application Priority Data
Feb. 3, 2010 (DE) .......................... 10 2010 006 724

(51) Int. Cl.
C30B 13/00 (2006.01)
C30B 15/06 (2006.01)
C30B 11/00 (2006.01)
C30B 15/02 (2006.01)
C30B 29/06 (2006.01)

(52) U.S. Cl.
CPC ................. C30B 13/00 (2013.01); *C30B 15/06* (2013.01); *C30B 11/00* (2013.01); *C30B 15/02* (2013.01); *C30B 29/06* (2013.01)
USPC ................... 117/37; 117/18; 117/30; 117/33; 117/11; 117/214

(58) Field of Classification Search
USPC .............. 117/27, 37, 11, 18, 30, 33, 214, 222
See application file for complete search history.

(56) References Cited

U.S. PATENT DOCUMENTS

| 4,045,278 A * | 8/1977 | Keller .............................. 117/52 |
| 7,655,089 B2 | 2/2010 | von Ammon |
| 2003/0145781 A1 | 8/2003 | von Ammon |
| 2009/0223949 A1* | 9/2009 | Altmannshofer et al. .... 219/672 |
| 2010/0158783 A1 | 6/2010 | von Ammon |
| 2011/0095018 A1 | 4/2011 | von Ammon et al. |

FOREIGN PATENT DOCUMENTS

| DE | 102 04 178 A1 | 9/2003 |
| DE | 10 2008 013 326 A1 | 9/2009 |
| EP | 2 319 961 A1 | 5/2011 |
| JP | 09142988 A * | 6/1997 |

* cited by examiner

*Primary Examiner* — Michael Kornakov
*Assistant Examiner* — Hua Qi
(74) *Attorney, Agent, or Firm* — Brooks Kushman P.C.

(57) ABSTRACT

Silicon single crystals are prepared from molten granules, by
  producing a first volume of molten silicon between a growing single crystal and the lower end of a silicon conical tube which is closed at its lower end, and encloses a central opening of a rotating silicon plate below which the tube extends, by means of a first induction heating coil arranged below the plate;
  producing a second volume of molten silicon by a second induction heating coil arranged above the plate;
  melting the lower end of the tube to form a passage for the second volume of molten silicon, the passage produced at a point in time when the second volume is not yet present or is less than double the volume of the first volume; and
  crystallizing monocrystalline silicon on the growing single crystal with consumption of molten silicon from the first and the second volume.

8 Claims, 1 Drawing Sheet

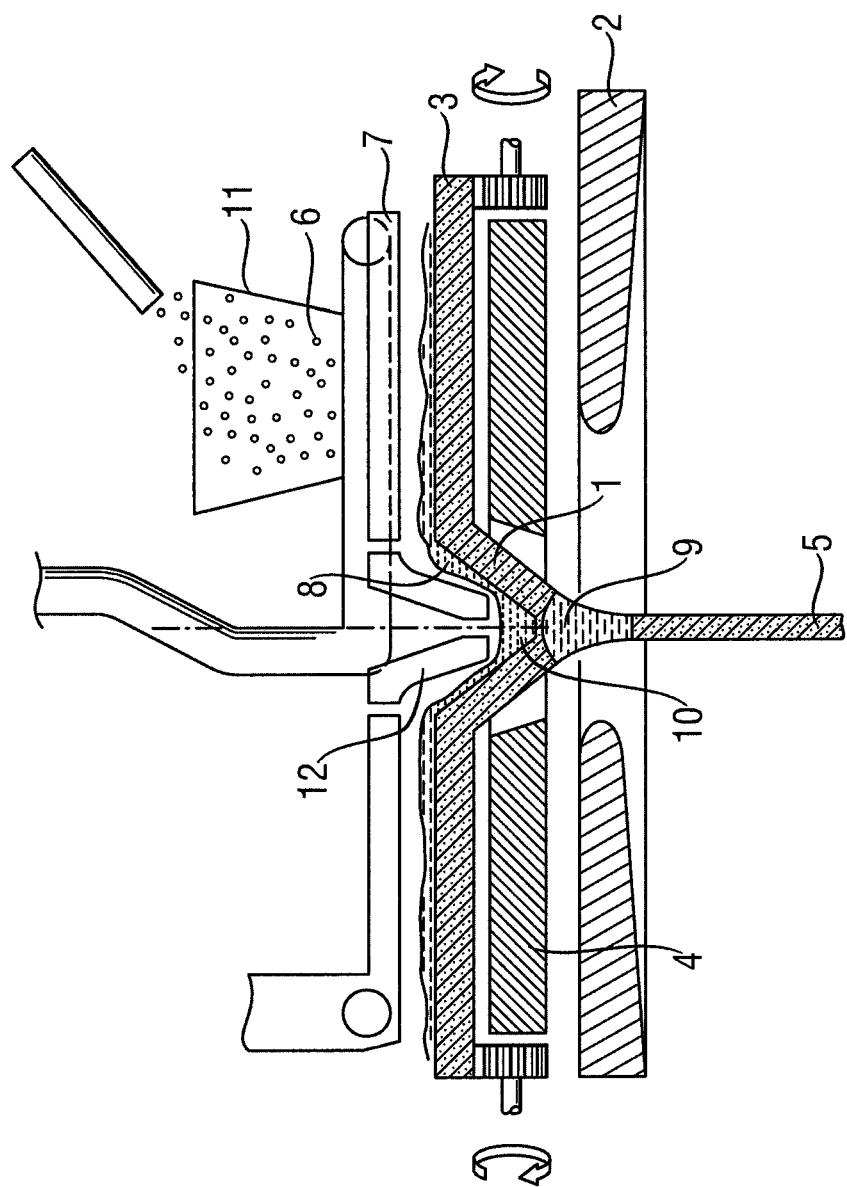

METHOD FOR PRODUCING A SINGLE CRYSTAL COMPOSED OF SILICON USING MOLTEN GRANULES

CROSS-REFERENCE TO RELATED APPLICATION

This application claims priority to German Patent Application No. DE 10 2010 006 724.5 filed Feb. 3, 2010 which is herein incorporated by reference.

BACKGROUND OF THE INVENTION

1. Field of the Invention

The invention relates to a method for producing a single crystal composed of silicon from molten granules. The method comprises producing a first volume of molten silicon between a growing single crystal and the lower end of a conical tube composed of silicon, the tube being closed off at the lower end and enclosing a central opening of a rotating plate composed of silicon, below which the tube extends, by means of a first induction heating coil, which is arranged below the plate;

producing a second volume of molten silicon with the aid of a second induction heating coil, which is arranged above the plate;

melting the lower end of the tube to an extent such that a passage opening for the second volume of molten silicon is produced; and crystallizing monocrystalline silicon on the growing single crystal with consumption of molten silicon from the first and the second volume.

2. Background Art

The method and devices suitable for carrying it out are described in DE 102 04 178 A1. DE 10 2008 013 326 A1 describes an induction heating coil which can be used as the second induction heating coil of the method. It has projecting segments in the center of the lower side, with the aid of which segments the film of molten silicon that flows through the conical tube can be heated and kept liquid. When carrying out the method, it is possible for disturbing events to occur which reduce the yield of single crystals from which monocrystalline semiconductor wafers can be fabricated. Thus, dislocations can suddenly form or molten silicon flows away at the side of the single crystal that has grown up to that point.

These methods differ from the floating zone method (FZ method) essentially by the fact that granules are melted instead of a polycrystalline block in order to provide the predominant portion of the molten silicon required for growing the single crystal and by virtue of the fact that a dedicated induction heating coil ("inductor coil") is respectively used for melting the granules and for controlling the crystallization of the single crystal.

SUMMARY OF THE INVENTION

The inventors have investigated the cause of the disturbances described above, and in the process, the present invention arose. It is an object of the invention to reduce the occurrence of the disturbing events described. These and other objects are achieved by means of a method for producing a single crystal composed of silicon using molten granules, comprising producing a first volume of molten silicon between a growing single crystal and the lower end of a conical tube composed of silicon, which tube is closed off at the lower end and encloses a central opening of a rotating plate composed of silicon, below which the tube extends, by means of a first induction heating coil which is arranged below the plate;

producing a second volume of molten silicon with the aid of a second induction heating coil which is arranged above the plate;

melting the lower end of the tube to an extent such that a passage opening for the second volume of molten silicon is produced, the passage opening being produced at a point in time at which the second volume of molten silicon is not yet present or is less than double the volume of the first volume of molten silicon; and crystallizing monocrystalline silicon on the growing single crystal with consumption of molten silicon from the first and the second volume.

BRIEF DESCRIPTION OF THE DRAWINGS

FIG. 1 illustrates one embodiment of the method of the invention.

DETAILED DESCRIPTION OF THE PREFERRED EMBODIMENTS

Firstly a thin neck, then a conically extended section of the single crystal, and finally a cylindrical section of the single crystal are crystallized. At the start of the method, the molten silicon required for crystallization originates from a seed crystal and from the lower end of the conical tube, which is melted for this purpose. In the further course of the method, molten silicon required for crystallization is also obtained by melting the upper side of the plate and the inner wall of the tube with the aid of the second induction heating coil. A predominant portion of the silicon required for crystallizing the single crystal is obtained by granules conveyed onto the plate being melted with the aid of the second induction heating coil and being conducted as a liquid film through the tube to the growing single crystal.

At the beginning of the method, the conical tube, which at this point in time is closed off at its lower end, is incipiently melted with the aid of the first induction heating coil arranged below the plate. A drop of molten silicon arises at the lower end of the conical tube. A seed crystal is attached to this drop. Afterward, the seed crystal is recrystallized with the aid of the first induction heating coil to form a thin neck and the volume of molten silicon on the resultant thin neck is increased to a first volume of molten silicon by further silicon from the lower end of the tube gradually being melted. Analogously to the FZ method, on the thin neck a dislocation-free conically extended section of the single crystal and finally a cylindrical section of the single crystal are crystallized. During the crystallization of the conically extended section of the single crystal or even before, the lower end of the conical tube is melted to an extent such that a passage opening for molten silicon is produced at the lower end of the tube. Starting from this point in time, a second volume of molten silicon can flow along the inner wall of the tube and through the passage opening into the first volume of molten silicon. The second volume of molten silicon is produced with the aid of the second induction heating coil.

An excessively high loading of the growing single crystal on account of the production of the passage opening in the conical tube was identified as a cause of the disturbing events. The growing single crystal is loaded if the second volume of molten silicon flows virtually instantaneously into the first volume of molten silicon with the production of the passage opening. According to the invention, this loading is limited by the passage opening being produced at a point in time at which the second volume of molten silicon is not yet present or is less than double the volume of the first volume of molten silicon. If the method is carried out with this measure, the disturbing events previously described become significantly rarer.

The invention is explained in more detail below with reference to FIG. 1. FIG. 1 shows the phase shortly before the passage opening is produced in the conical tube.

At the beginning of the method, the lower end of the conical tube 1 is incipiently melted with the aid of the first induction heating coil 2, a drop of molten silicon arising. In this phase the first induction heating coil and the conical tube are preferably arranged with respect to one another in such a way that the distance between the edge of the internal hole in the first induction heating coil and the drop of molten silicon is as small as possible. The distance is preferably shortened by displacing the first induction heating coil from a coaxial arrangement to the side. The energy density transmitted inductively to the drop and the lower end of the tube is then higher than in the case of a coaxial arrangement of the conical tube and the first induction heating coil. At a later point in time, in particular when the cylindrical section of the single crystal is being crystallized, the coaxial arrangement is preferred. The conical tube 1 encloses a central opening in a rotating plate 3 composed of silicon and extends below the plate. The lower side of the plate is cooled with the aid of a cooling device 4 arranged between the plate and the first induction heating coil 2, in order that the lower side of the plate 3 is not melted. The cooling device 4 can also be embodied as an upper layer of the first induction heating coil 2.

A monocrystalline seed crystal is dipped from below into the drop of molten silicon produced as a result of the incipient melting of the lower end of the tube. The seed crystal is thereupon recrystallized with the aid of the first induction heating coil 2 to form a thin neck 5 in order that dislocations that form when the seed crystal is brought into contact with the drop are directed away from the crystal lattice. In the further course of the method, the vertical distance between the thin neck 5 and the end of the conical tube 1 is progressively increased, and firstly a conically extended section (not illustrated) of the single crystal is crystallized on the thin neck 5 and then a cylindrical section (likewise not illustrated) of the single crystal is crystallized on the conically extended section.

The single crystal preferably contains at least one dopant which is added to the molten silicon, for example in the form of doping gas or is contained in the silicon prior to melting.

The molten silicon required for crystallization originates initially from the seed crystal and from the lower end of the conical tube, later from the upper side of the plate, from the inner wall of the tube and, in particular during the crystallization of the cylindrical section of the single crystal, from granules 6 conveyed onto the plate 3, the granules being melted by means of a second induction heating coil 7 which is arranged above the plate 3, and being conducted as a liquid film 8 through the tube to the growing single crystal. Molten granules can also already have been used for the crystallization of the conically extended section of the single crystal.

The second induction heating coil is preferably embodied like an induction heating coil described in DE 10 2008 013 326 A1 having segments 12 projecting into the conical tube 1.

FIG. 1 illustrates the situation in which the thin neck 5 of the single crystal has already been crystallized. The first volume 9 of molten silicon is situated between the lower end of the conical tube 1 closed off there and the thin neck 5.

In accordance with a first embodiment of the method, a second volume 10 of molten silicon is produced in the closed-off conical tube 1 by means of the upper side of the rotating plate 3 and the inner wall of the conical tube 1 being melted with the aid of the second induction heating coil 7. The second volume 10 of molten silicon accumulates in the lower end of the conical tube. At this point in time it may also already contain molten silicon originating from granules 6 which were conveyed onto the rotating plate 3 through one or more funnels 11 and a corresponding number of openings in the second induction heating coil 7 and were subsequently melted with the aid of the second induction heating coil 7.

The lower end of the conical tube 1 is melted further with the aid of the first induction heating coil 2 until that part of the lower end of the conical tube which closes off the conical tube 1 at the lower end thereof has been completely melted. As a result, a passage opening is produced in the conical tube 1, through which passage opening the second volume 10 of molten silicon that has accumulated in the tube flows virtually instantaneously into the first volume 9 of molten silicon. It is preferred to support the production of the passage opening by temporarily lowering the segments 12—which project into the tube—of the second induction heating coil 7 to a shorter distance from the inner wall of the tube until the passage opening has been produced.

In accordance with the first embodiment of the method the passage opening is produced at a point in time at which the second volume 10 of molten silicon is less than double the volume of the first volume 9 of molten silicon. In this case, the sensitive system constituted by the growing single crystal is disturbed only slightly, thus resulting in low probability of dislocations being formed or molten silicon of the combined melt volumes proceeding beyond the edge of the interface to the growing single crystal.

In accordance with a second embodiment of the method, the passage opening is produced in the conical tube 1 at a point in time at which as yet there is no second volume 10 of molten silicon in the conical tube. In this case, the process of melting silicon with the aid of the second induction heating coil 7 is begun only after the passage opening has been produced in the conical tube. In the case of this procedure, too, associated disturbances of the growing single crystal remain to an insignificant extent.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a single crystal composed of silicon from molten granules, comprising
producing a first volume of molten silicon between a growing single crystal and the lower end of a conical tube of silicon, the tube closed off at a lower end thereof and enclosing a central opening of a rotating plate composed of silicon, below which the tube extends, the first volume of molten silicon produced by means of a first induction heating coil which is arranged below the plate;
producing a second volume of molten silicon with the aid of a second induction heating coil which is arranged above the plate;
melting the lower end of the tube to an extent such that a passage opening for the second volume of molten silicon is formed, the passage opening being produced at a point in time at which the second volume of molten silicon is not yet present or is less than double the volume of the first volume of molten silicon; and crystallizing monocrystalline silicon on the growing single crystal with consumption of molten silicon from the first and the second volumes.

2. The method of claim 1, comprising forming of the passage opening by lowering segments of the second induction heating coil which project into the tube.

3. The method of claim 1, comprising producing a part of the second volume of molten silicon by melting silicon from an upper side of the plate and from an inner wall of the tube.

4. The method of claim 2, comprising producing a part of the second volume of molten silicon by melting silicon from an upper side of the plate and from an inner wall of the tube.

5. The method of claim 1, comprising beginning the melting of granules conveyed to the plate during or after crystallization of a conically extended section of the single crystal.

6. The method of claim 2, comprising beginning the melting of granules conveyed to the plate during or after crystallization of a conically extended section of the single crystal.

7. The method of claim 3, comprising beginning the melting of granules conveyed to the plate during or after crystallization of a conically extended section of the single crystal.

8. The method of claim 4, comprising beginning the melting of granules conveyed to the plate during or after crystallization of a conically extended section of the single crystal.

* * * * *